United States Patent [19]
Fratti et al.

[11] Patent Number: 6,011,432
[45] Date of Patent: Jan. 4, 2000

[54] CONTINUOUS TUNING OF SWITCHED CAPACITOR CIRCUITS USING DC-ISOLATED TUNING ELEMENTS

[75] Inventors: Roger A. Fratti, Shillington; Douglas D. Lopata, Boyertown, both of Pa.

[73] Assignee: Lucent Technologies Inc., Murray Hill, N.J.

[21] Appl. No.: 09/121,147

[22] Filed: Jul. 23, 1998

[51] Int. Cl.[7] .................................................. H03K 5/00
[52] U.S. Cl. ........................ 327/554; 327/337; 327/308; 333/172
[58] Field of Search .................... 327/308, 552, 327/554, 322, 337, 94; 333/172; 341/143; 330/9

[56] References Cited

U.S. PATENT DOCUMENTS 4,731,585  3/1988  Fox .......................................... 327/322
5,719,573  2/1998  Leung et al. ............................. 341/143

*Primary Examiner*—Dinh T. Le

[57] ABSTRACT

Circuits having switched capacitors that are implemented with T-structures in which one of the three capacitors in the T-structure is implemented with a buffer amplifier configured to receive a control signal (e.g., a control voltage) and to apply a buffered control signal to an active device having a capacitance that is dependent on the control signal level. In one embodiment, the control signal is a control voltage, the active device is a varactor diode, and the circuit is a ladder filter having one or more switched capacitors, each of which is implemented using the T-structure of the present invention. Under the present invention, continuously tunable circuits can be implemented with discrete elements where the circuits can be tuned by changing the control signal in one or more of the switched capacitors, without having to provide a continuously tunable clock.

10 Claims, 5 Drawing Sheets

CONTINUOUS TUNING OF SWITCHED CAPACITOR CIRCUITS USING DC-ISOLATED TUNING ELEMENTS

BACKGROUND OF THE INVENTION

1. Field of the Invention

The present invention relates to integrated circuits, and, in particular, to circuits having switched capacitors.

2. Description of the Related Art

FIG. 1 shows a circuit diagram of a conventional ladder filter structure. The ladder structure comprises shunt resonant LC tanks implemented with amplifiers, capacitors, and resistors, which are then coupled by series coupling capacitors $C_1$, $C_2$, . . . .

FIGS. 2(A) and 2(B) show circuit diagrams of conventional single-ended and differential implementations, respectively, of the +/−R resistive elements in the ladder filter of FIG. 1. These implementations, which consist of one or two discrete capacitors $C_R$ configured with sets of switches $S_i$, are referred to as switched capacitors. The relative phasing of the opening and closing of the various switches (as controlled by a clock signal) dictates whether the switched capacitor implements a +R element or a −R element.

For a given capacitance value $C_R$ and a given clock frequency, the ladder filter of FIG. 1 will have a specific fixed frequency response. When implemented with discrete elements, the capacitance value $C_R$ will be fixed for a given implementation and, as a result, the only way to change the frequency response of the ladder filter is to change the clock frequency. Unfortunately, most integrated circuits have only a finite number of discrete clock frequencies available. As such, the number of different frequency responses for the ladder filter are also limited to a finite number of discrete responses.

SUMMARY OF THE INVENTION

The present invention is directed to a technique for implementing circuits with switched capacitors, such as the ladder filter of FIG. 1, so that they can be continuously tuned.

According to one embodiment, the present invention is an integrated circuit comprising a switched capacitor wherein the switched capacitor is implemented as a DC-isolated variable capacitor. The DC-isolated variable capacitor is implemented as a T-structure having three capacitors in which one of the three capacitors is implemented with a buffer amplifier configured to receive a control signal and to apply a buffered control signal to an active device having a capacitance that is dependent on the level of the buffered control signal.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

The matrix-based Y-parameter representation for a capacitor C is given by Equation (1) as follows:

$$[Y] = \begin{bmatrix} sC & -sC \\ -sC & sC \end{bmatrix} \quad (1)$$

Figure 3:
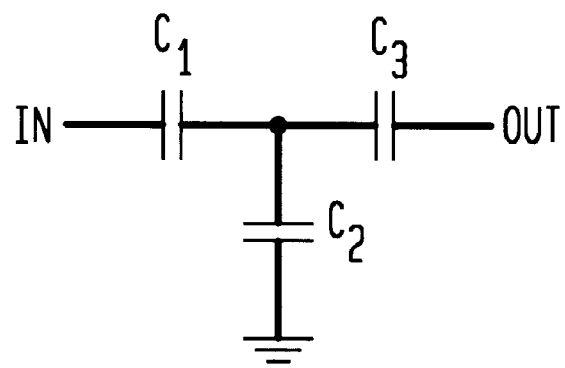
FIG. 3 shows a T-structure corresponding to a capacitor C.

FIG. 3 shows a T-structure corresponding to the capacitor C. The Y-parameter representation for the T-structure of FIG. 3 is given by Equation (2) as follows:

$$[Y] = \begin{bmatrix} \dfrac{sC_1(C_2+C_3)}{C_1+C_2+C_3} & \dfrac{-sC_3 C_1}{C_1+C_2+C_3} \\ \dfrac{-sC_3 C_1}{C_1+C_2+C_3} & \dfrac{sC_3(C_1+C_2)}{C_1+C_2+C_3} \end{bmatrix} \quad (2)$$

For exact equivalence between the T-structure of FIG. 3 and the capacitor C, the relationships of Equations (3)–(5) must be true:

$$sC = \frac{sC_3 C_1}{C_1+C_2+C_3} \quad (3)$$

$$sC = \frac{sC_1(C_2+C_3)}{C_1+C_2+C_3} \quad (4)$$

$$sC = \frac{sC_3(C_1+C_2)}{C_1+C_2+C_3} \quad (5)$$

Expanding the right hand side of Equation (4) and substituting Equation (3) yields the relationship of Equation (6) as follows:

$$sC = \frac{sC_1 C_2}{C_1+C_2+C_3} + \frac{sC_1 C_3}{C_1+C_2+C_3} \quad (6)$$

$$= sC + \frac{sC_1 C_2}{C_1+C_2+C_3}$$

Similarly, expanding the right hand side of Equation (5) and substituting Equation (3) yields the relationship of Equation (7) as follows:

$$sC = \frac{sC_3 C_1}{C_1+C_2+C_3} + \frac{sC_3 C_2}{C_1+C_2+C_3} \quad (7)$$

$$= sC + \frac{sC_3 C_2}{C_1+C_2+C_3}$$

As indicated by Equations (6) and (7), the equivalence between the capacitor C of Equation (1) and the T-structure of FIG. 3 and Equation (2) can be satisfied with the addition of small error terms. These error terms can be minimized by the proper selection of $C_1$, $C_2$, and $C_3$.

Figure 4:
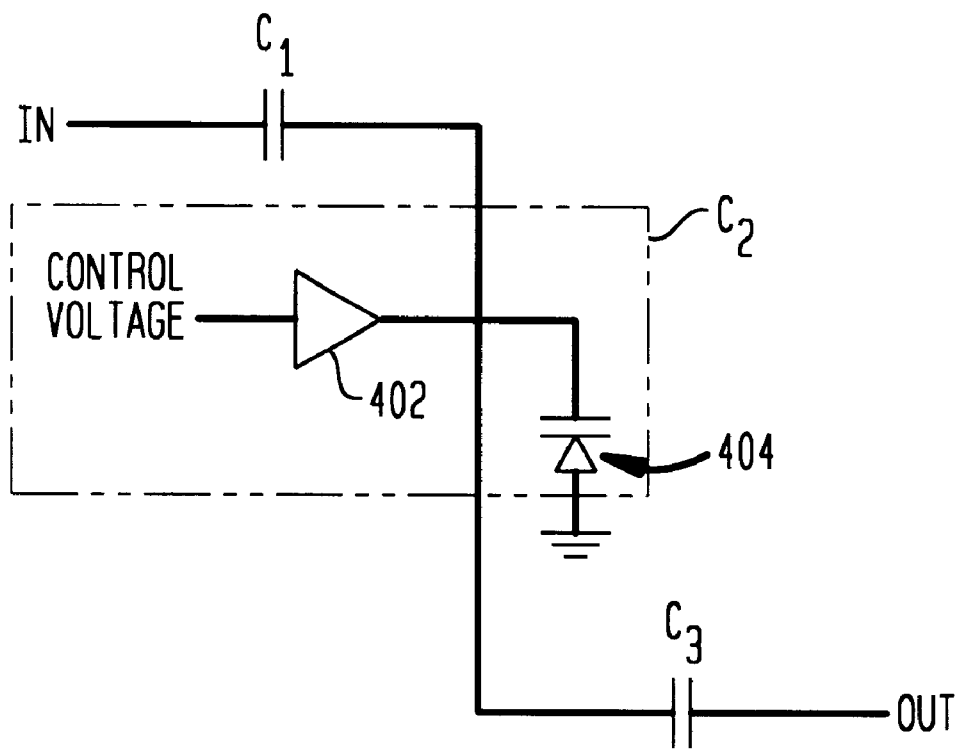
FIG. 4 shows an implementation of the T-structure of FIG. 3, according to one embodiment of the present invention.

FIG. 4 shows an implementation of the T-structure of FIG. 3, according to one embodiment of the present invention. As shown in FIG. 4, capacitor $C_2$ in the T-structure of FIG. 3 is implemented using a voltage-controlled buffer 402 and a varactor diode 404. Buffer 402 is a high-impedance output buffer that provides isolation and preconditions and/or scales the control voltage. Varactor diode 404 is a diode that exhibits a change in its junction capacitance as a function of an applied reverse-bias potential voltage (i.e., the voltage at the output of buffer 402). As such, the circuit of FIG. 4 corresponds to the implementation of a DC-isolated variable capacitor. The DC-isolating feature of the T-structure allows the circuit of FIG. 4 to be embedded in a switched capacitor filter.

Figure 1:
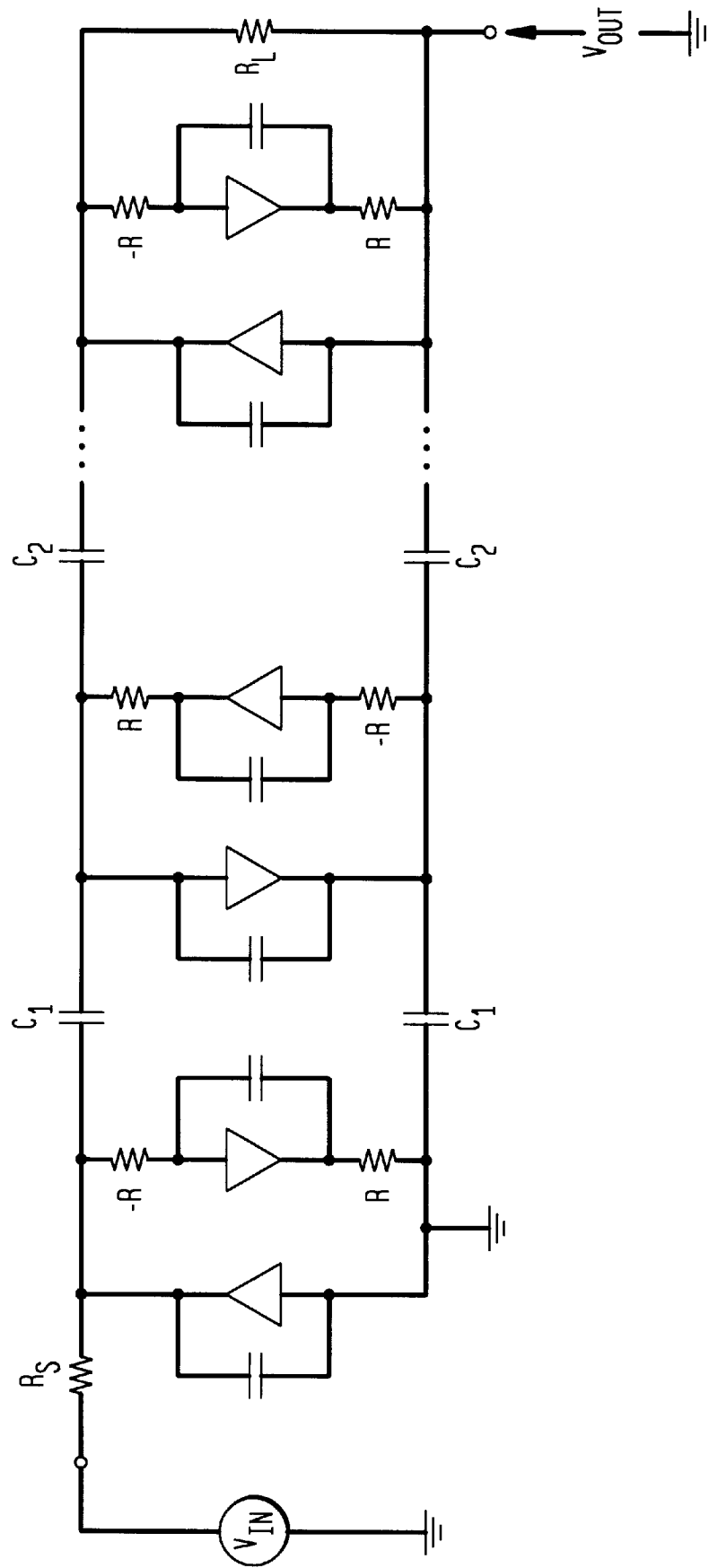
FIG. 1 shows a circuit diagram of a conventional ladder filter structure.
Figure 2A:
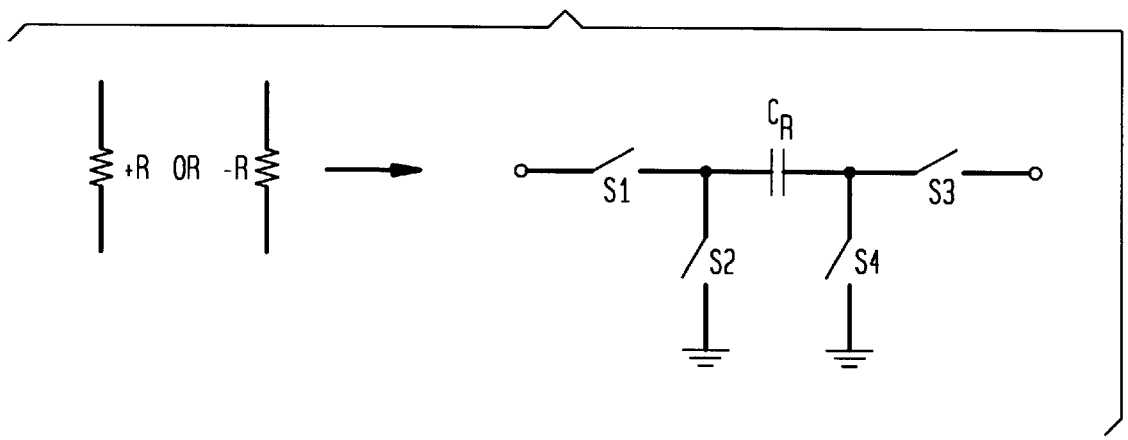
FIGS. 2(A) and 2(B) show circuit diagrams of conventional single-ended and differential implementations, respectively, of the +/−R resistive elements in the filter of FIG. 1.
Figure 2B:
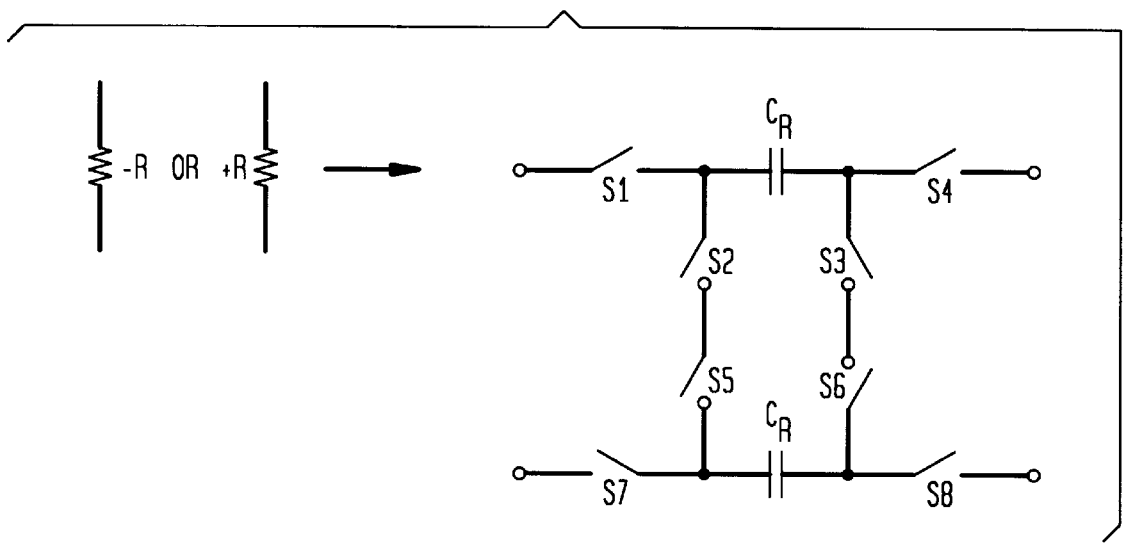
Figure 5:
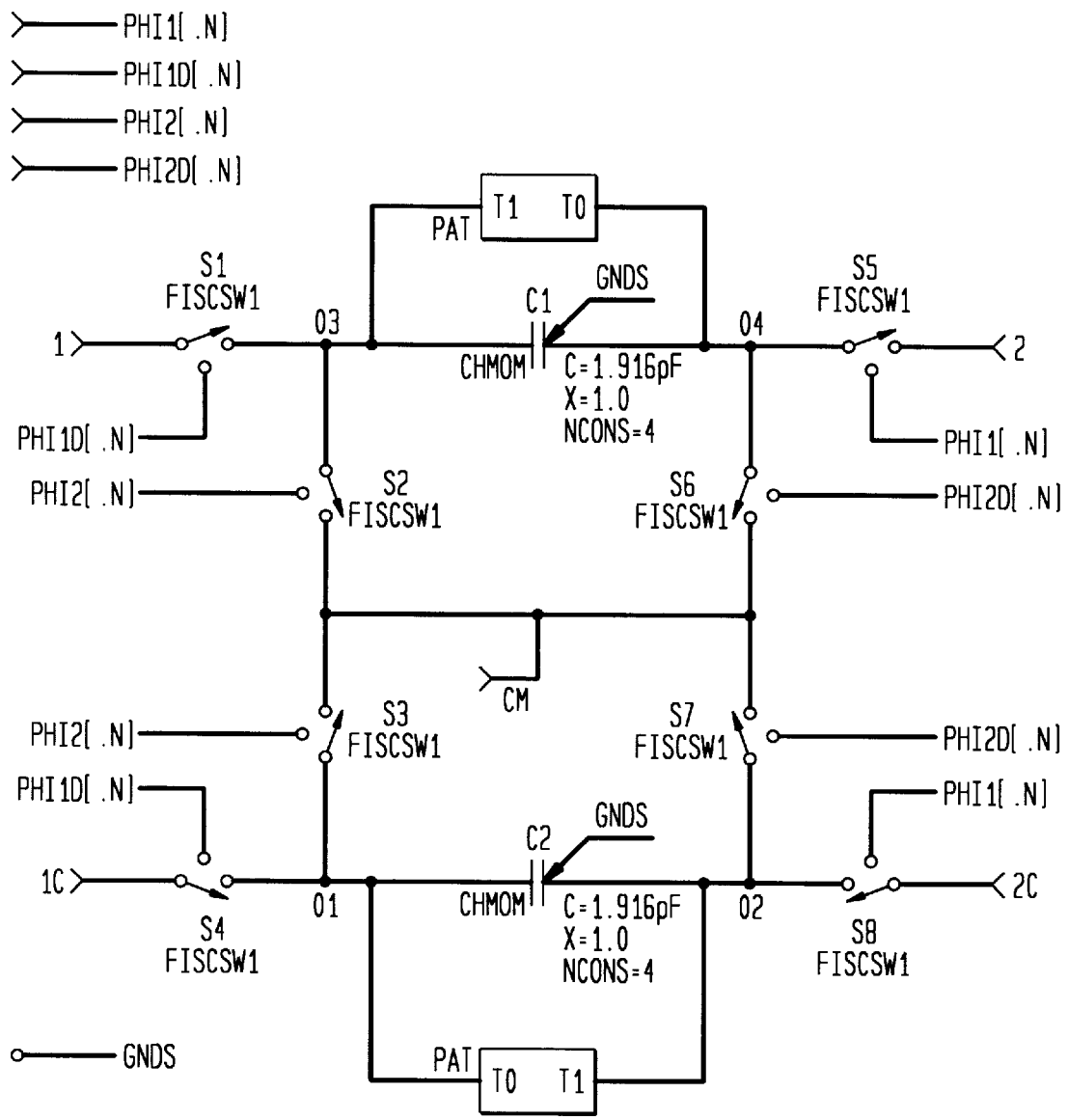
FIG. 5 shows a differential implementation corresponding to FIG. 2(B) of a +/−R element of the ladder filter of FIG. 1, according to one embodiment of the present invention.

FIG. 5 shows a differential implementation corresponding to FIG. 2(B) of a +/−R element of the ladder filter of FIG. 1, according to one embodiment of the present invention. Each element PAT in the circuit of FIG. 5 corresponds to an instance of the T-structure circuit of FIG. 4. Capacitors C1 and C2 in FIG. 5 (not to be confused with capacitors $C_1$ and $C_2$ of FIGS. 3 and 4) are optional components that can be used to establish a nominal filter response, with the elements PAT providing controllable perturbations to the performance of the filter.

Using the circuit of FIG. 4 to implement the ladder filter of FIG. 1 provides a ladder filter having a frequency response that can be continuously tuned simply by adjusting the level of the control voltage in FIG. 4. As such, a continuously tunable filter can be implemented using discrete elements without having to provide a continuously tunable clock to control the switches used to implement the switched capacitors of FIGS. 2(A), 2(B), and 5.

Figure 6A:
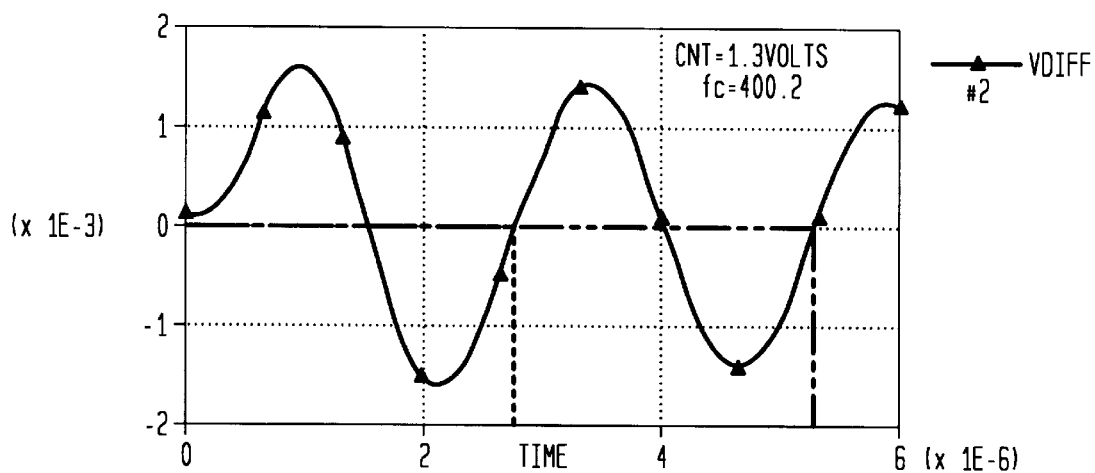
FIGS. 6(A)–(C) show the step response of the ladder filter of FIG. 1 implemented according to the present invention with the circuit of FIG. 5 for three different control voltage levels.
Figure 6B:
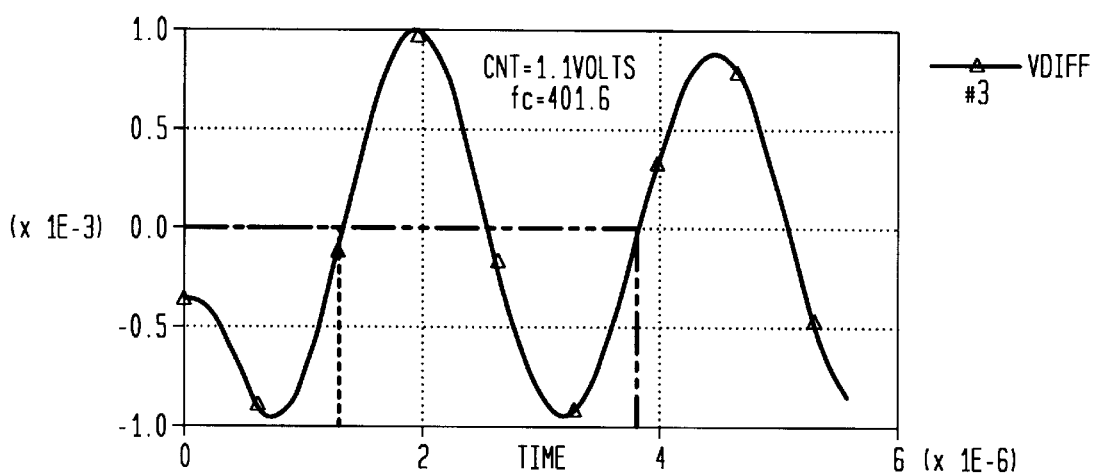
Figure 6C:
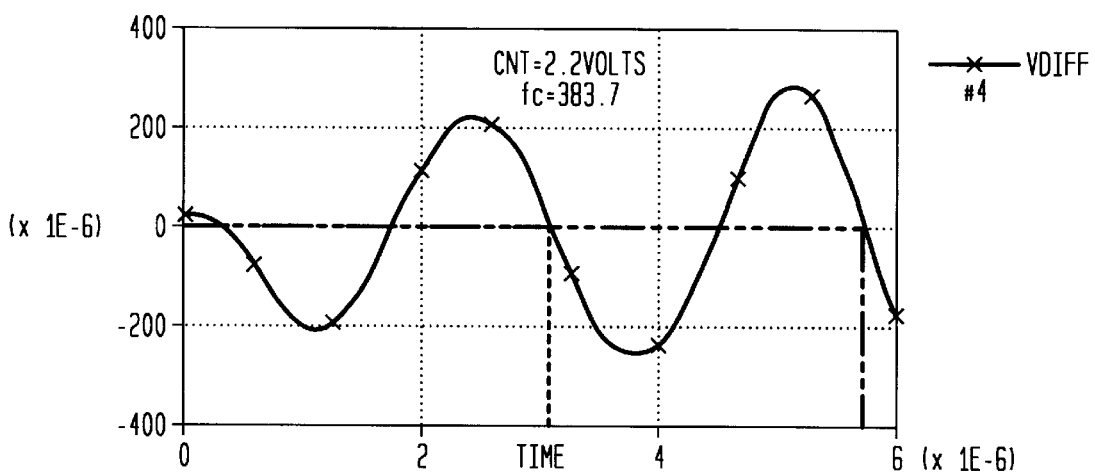

FIGS. 6(A)–(C) show the step response of the ladder filter of FIG. 1 implemented according to the present invention with the circuit of FIG. 5 for three different control voltage levels (i.e., 1.3 V for FIG. 6(A), 1.1 V for FIG. 6(B), and 2.2 V for FIG. 6(C)). The output frequency responses for these three control voltage levels are 400.2 Hz, 401.6 Hz, and 383.7 Hz, respectively, demonstrating the inverse relationship between control voltage and frequency response over this range of control voltages.

Although the present invention has been described as being implemented with varactor diodes, those skilled in the art will understand that other suitable devices with voltage-dependent capacitances can be used. For example, the present invention can be implemented using MESFETs or MOSFETs with gate-to-source capacitances that vary with applied gate voltage. Similarly, the present invention can be implemented using active devices whose capacitance varies with a control signal other than a control voltage, such as a control current.

Although the present invention has been described in the context of the use of switched capacitors in a ladder filter, it will be understood that the present invention can be implemented in any suitable circuit having switched capacitors where continuous tuning of the circuit is desired.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An integrated circuit comprising one or more DC-isolated variable capacitors, wherein each variable capacitor comprises three capacitive elements configured in a T-structure, wherein:
   a first capacitive element is connected between an input node of the variable capacitor and a common node of the variable capacitor;
   a second capacitive element is connected between the common node and a reference node of the variable capacitor;
   a third capacitive element is connected between the common node and an output node of the variable capacitor;
   the second capacitive element comprises:
      (a) a buffer amplifier connected between a control signal node of the variable capacitor and the common node; and
      (b) an active device connected between the common node and the reference node, wherein:
         the active device has a capacitance that is dependent on a voltage level of the common node; and
         when a control signal is applied to the control signal node, the buffer amplifier generates and applies a buffered control signal to the common node to control the capacitance of the active device, thereby adjusting the capacitance of the DC-isolated variable capacitor.

2. The invention of claim 1, wherein the first and second capacitive elements are discrete capacitors.

3. The invention of claim 2, wherein the control signal is a control voltage and the active device is a varactor diode having its gate connected to the common node and its source connected to the reference node.

4. The invention of claim 3, wherein the reference node is ground.

5. The invention of claim 1, wherein the control signal is a control voltage and the active device is a varactor diode having its gate connected to the common node and its source connected to the reference node.

6. The invention of claim 1, wherein the reference node is ground.

7. The invention of claim 1, wherein each DC-isolated variable capacitor is part of a switched capacitor circuit of the integrated circuit.

8. The invention of claim 1, wherein the integrated circuit comprises a ladder filter, wherein each DC-isolated variable capacitor is part of a switched capacitor circuit of the ladder filter.

9. The invention of claim 8, wherein the ladder filter is continuously tunable by controlling the control signal in each variable capacitor.

10. The invention of claim 9, wherein:
   the first and second capacitive elements are discrete capacitors;
   the control signal is a control voltage and the active device is a varactor diode having its gate connected to the common node and its source connected to the reference node; and
   the reference node is ground.

* * * * *